(12) United States Patent
Singh et al.

(10) Patent No.: US 10,868,899 B2
(45) Date of Patent: Dec. 15, 2020

(54) FILM FOR APPLYING COMPRESSIVE STRESS TO CERAMIC MATERIALS

(71) Applicants: SINMAT, INC., Gainesville, FL (US); UNIVERSITY OF FLORIDA RESEARCH FOUNDATION, INC., Gainesville, FL (US)

(72) Inventors: Rajiv K. Singh, Newberry, FL (US); Deepika Singh, Newberry, FL (US)

(73) Assignees: ENTEGRIS, INC., Billerica, MA (US); UNIVERSITY OF FLORIDA RESEARCH FOUNDATION, INC., Gainesville, FL (US)

( * ) Notice: Subject to any disclaimer, the term of this patent is extended or adjusted under 35 U.S.C. 154(b) by 0 days.

(21) Appl. No.: 16/015,428

(22) Filed: Jun. 22, 2018

(65) Prior Publication Data
US 2018/0375978 A1   Dec. 27, 2018

Related U.S. Application Data

(60) Provisional application No. 62/524,105, filed on Jun. 23, 2017.

(51) Int. Cl.
C03C 17/22 (2006.01)
H04M 1/02 (2006.01)
(Continued)

(52) U.S. Cl.
CPC ........... *H04M 1/0266* (2013.01); *B32B 7/02* (2013.01); *C03C 17/22* (2013.01); *C03C 17/225* (2013.01);
(Continued)

(58) Field of Classification Search
CPC .......... B32B 7/02; B05D 5/00; H04M 1/0266; C03C 17/22; C03C 17/225; C03C 2217/28; C03C 2218/322
See application file for complete search history.

(56) References Cited

U.S. PATENT DOCUMENTS 6,118,586 A * 9/2000 Tanabe ............... G02B 5/1833
359/566
6,167,099 A   12/2000 Rader et al.
(Continued)

FOREIGN PATENT DOCUMENTS

WO   2014144562 A1   9/2014
WO   2015127583 A1   9/2015

OTHER PUBLICATIONS

C.M. Liu, et al., "The effect of annealing, precipitation-strengthening, and compressive coating processes on sapphire strength", Materials Science & Engineering, A 420 (2006), pp. 212-219.

*Primary Examiner* — Nathan H Empie
(74) *Attorney, Agent, or Firm* — Entegris, Inc.

(57) ABSTRACT

A method to provide compressive stress to substrates includes depositing a film on a ceramic substrate at a deposition temperature (Td) to form an article, the film having a difference relative to the ceramic substrate at Td in a coefficient thermal expansion (CTE) of at least $1.0 \times 10^{-6}$/K and a difference in a refractive index >0.10. At least a portion of the thickness the film is converted in at least one of composition, phase and microstructure by lowering or raising the temperature from Td to reach a changed temperature (Tc) that is at least 100° C. different from Td. The film converting conditions result in the converted film portion providing a difference in refractive index at the Tc between the converted film and the ceramic substrate of ≤|0.10|. The temperature of the article is then lowered to room temperature.

16 Claims, 3 Drawing Sheets

(51) Int. Cl.

| | | |
|---|---|---|
| *C30B 29/20* | (2006.01) | |
| *B32B 7/02* | (2019.01) | |
| *C30B 33/00* | (2006.01) | |
| *C23C 14/06* | (2006.01) | |
| *C23C 16/30* | (2006.01) | |
| *C04B 111/80* | (2006.01) | |
| *G06F 1/16* | (2006.01) | |

(52) U.S. Cl.
CPC ........ *C23C 14/0676* (2013.01); *C23C 16/308* (2013.01); *C30B 29/20* (2013.01); *C30B 33/00* (2013.01); *C03C 2217/28* (2013.01); *C03C 2217/281* (2013.01); *C03C 2218/322* (2013.01); *C04B 2111/805* (2013.01); *G06F 1/1637* (2013.01)

(56) References Cited

U.S. PATENT DOCUMENTS

| | | | |
|---|---|---|---|
| 8,872,246 B1* | 10/2014 | Stevens | H01L 45/08 257/2 |
| 2005/0195486 A1* | 9/2005 | Sasaki | G02B 1/11 359/580 |
| 2006/0189014 A1* | 8/2006 | Li | H01L 31/03046 438/28 |
| 2014/0272298 A1* | 9/2014 | Memering | C23C 28/04 428/142 |
| 2014/0346557 A1* | 11/2014 | Yoshida | H01S 5/0282 257/103 |

* cited by examiner

FILM FOR APPLYING COMPRESSIVE STRESS TO CERAMIC MATERIALS

CROSS REFERENCE TO RELATED APPLICATIONS

This application claims the benefit of Provisional Application Ser. No. 62/524,105 entitled "FILM FOR APPLYING COMPRESSIVE STRESS TO CERAMIC MATERIALS", filed on Jun. 23, 2017, which is herein incorporated by reference in its entirety.

FIELD

Disclosed embodiments relate to films on ceramic substrates that mechanically strengthen the ceramic substrate including against cracking.

BACKGROUND

Ceramic materials such as sapphire glass, silica based-glasses and related materials are typically scratch resistant, but can suffer from catastrophic breakdown due to propagation of surface cracks. Such ceramic materials have widespread use in a large number of applications, including one particular application being for the screen of smart phones. It is generally known that inducing a compressive stress on the surface of a ceramic material can decrease the propensity of surface flaws to propagate and cause cracking of the ceramic material. It is also generally known that the stresses can be introduced on the surface of a material by forming a film on its surface.

Two types of stresses can be observed during film deposition processes on a substrate being (1) intrinsic growth stresses due to microstructural defects, impurities and defect evolution, and (2) thermal stresses due to differences in the coefficient of thermal expansion (CTE) of the initially deposited film ($\alpha_f$) and the CTE of the substrate ($\alpha_s$), where the CTE is being represented by the Greek symbol $\alpha$ it is typically represented as. If the film is deposited at a high temperature and then cooled down to room temperature and the CTE of the deposited film material is less than the CTE of the substrate (i.e., the CTE difference is negative or $(\alpha_f - \alpha_s) < 0$), then film will acquire a compressive stress when cooled to room temperature. Although this method imparts compressive stress on the film's surface, this method may not be suited for optical see-through applications because the difference in refractive index of the deposited film and the substrate can lead to optical interference effects which is detrimental for applications needing optical transparency.

SUMMARY

This Summary briefly indicates the nature and substance of this Disclosure. It is submitted with the understanding that it will not be used to interpret or limit the scope or meaning of the claims.

Disclosed embodiments include methods for creating compressive stress on a ceramic substrate by forming a film thereon that has a refractive index ($n_{film}$) which closely matches the refractive index of a ceramic substrate (hereafter $n_s$). A closely matched refractive index as defined herein refers to a difference in $n_{film}$ and $n_s$ that is less than or equal to 0.10 ($|(n_{film}) - (n_s)| \leq 0.10$). For example, if the $n_s$ is 1.77, the $n_{film}$ is between 1.67 and 1.87. Furthermore, disclosed films generally have a Vickers hardness values between 300 Kg/mm$^2$ and 10,000 Kg/mm$^2$, a Knoop Hardness value between 500 and 10,000, or a Mohs hardness value greater than 6.0.

A film is deposited on a ceramic substrate at a deposition temperature ($T_d$) to form an article. The film has a CTE that is different (lower or higher) than a CTE of the ceramic substrate by at least $1.0 \times 10^{-6}$/K, expressed as $|(\alpha_f - \alpha_s)| > 1.0 \times 10^{-6}$/K, and $|(n_{film}) - (n_s)| > 0.10$. A film converting step comprises lowering the temperature from $T_d$ to reach a changed temperature ($T_c$) that is at least 100° C. lower than $T_d$, or the increasing the temperature from $T_d$ to reach a Tc that is at least 100° C. higher than $T_d$. The film converting conditions result in at least a portion of the thickness of the film becoming a converted film in at least one property comprising composition, phase and/or microstructure so that $|(n_{film}) - (n_s)| \leq 0.10$, and in some embodiments $|(n_{film}) - (n_s)| < 0.05$. The temperature of the article is then lowered from Tc to room temperature.

The composition of the deposited film and converted film can comprise a compound having a formula $Al_xY_{(1-x)}O_aC_bN_c$, where the values of x range between 0 and 1, and the value of "a" ranges from 0 to 2, the value of "b" ranges from 0 to 1, while the value of "c" ranges from 0 to 2. Y refers elements which can comprise Si, Ga, a transition metal such as Ti, Cu, or V, or a non-transition metal such as Zn). In the specific embodiment when the ceramic substrate is sapphire ($Al_2O_3$), the deposited film is $AlO_aN_b$ and the values of "a" and "b" are adjusted to provide $|(n_{film}) - (n_s)| > 0.10$ and so that the converted film portion is $AlO_aN_b$, and the values of "a" and "b" are adjusted so that after conversion $|(n_{film}) - (n_s)| \leq 0.10$ such as $|(n_{film}) - (n_s)| < 0.05$. If the substrate is single crystal sapphire, the converted film portion in one embodiment is polycrystalline alumina ("b"=0.0 and "a"=1.5).

For an alumina on a sapphire substrate, the alumina film ($AlO_{1.5}$ or $Al_2O_3$) can be either in the alpha ($\alpha$) phase or the delta phase with a polycrystalline grain size range such as being 10 A to 40 microns. The alumina film may have a compressive stress ranging from 0.01 GPa to 2 GPa, while the sapphire substrate may have a tensile stress of at least 10 times lower than the film's compressive stress. At least one of the lattice parameters of the alpha alumina in the converted film portion will generally be at least 0.01% smaller than the ideal value for alumina (a=4.785 A, c=12.991 A) when measured by a suitable materials characterization techniques such as X-ray diffraction-based methods.

Another disclosed embodiment is where the substrate is sapphire, the deposited film $SiO_aN_b$ the values of "a" and "b" are adjusted where $|(n_{film}) - (n_s)| > 0.10$ so that the converted film portion is $SO_aN_b$, and the values of "a" and "b" are so adjusted during the conversion step such that after the conversion $|(n_{film}) - (n_s)| < 0.10$, such as or $|(n_{film}) - (n_s)| < 0.05$. The compressive stress in the converted film at room temperature can range from 0.001 GPa to 10 GPa, with one range being 0.01 GPa to 2 GPa, such as 0.1 GPa to 1 GPa, where the conversion comprises processing in a heated chamber where the substrate is held at the conversion temperature Tc.

During the film deposition, the film can acquire an intrinsic growth stress from −1 GPa, to +1 GPa where a negative stress value refers to a compressive stress while a positive stress value refers to a tensile stress. This intrinsic growth stress is augmented by the additional thermal stress due to film conversion and cooling to room temperature. The thickness of the film can vary from 100 A to 100 microns. The film conversion process can be performed by flowing one or more of carbon, oxygen or nitrogen containing gases.

DETAILED DESCRIPTION

Figure 1:
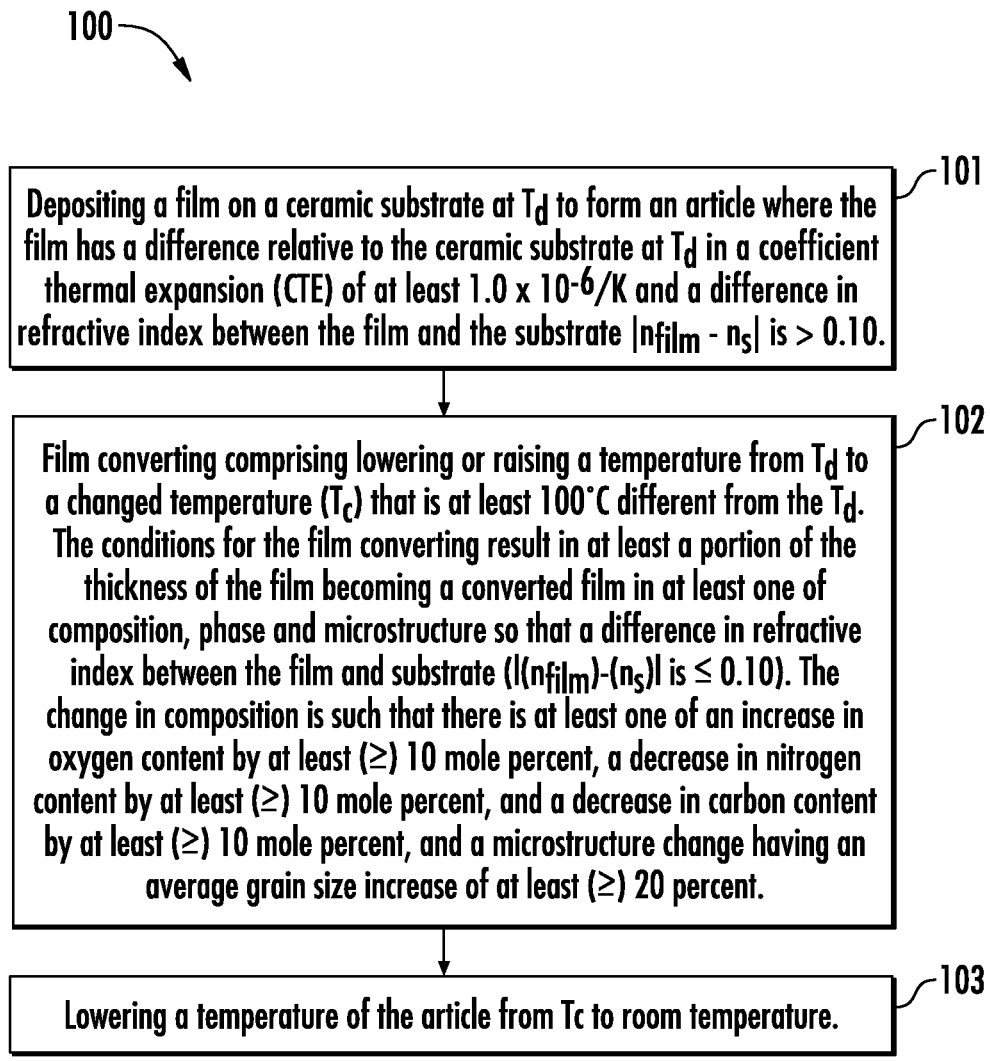
FIG. 1 is a flow chart that shows steps in an example method of forming an article having a film providing compressive stress to a ceramic substrate, according to an example embodiment.

Embodiments of the invention are described with reference to the attached figures, wherein like reference numerals are used throughout the figures to designate similar or equivalent elements. The figures are not drawn to scale and they are provided merely to illustrate certain features. Several aspects of this Disclosure are described below with reference to example applications for illustration.

It should be understood that numerous specific details, relationships, and methods are set forth to provide a full understanding of the subject matter in this Disclosure. One having ordinary skill in the relevant art, however, will readily recognize that embodiments of the invention can be practiced without one or more of the specific details or with other methods. In other instances, well-known structures or operations are not shown in detail to avoid obscuring subject matter. Embodiments of the invention are not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

One disclosed embodiment is a film-based method for providing compressive stress on a ceramic substrate. As noted above as used herein '$\alpha_f$' is the CTE of the initially deposited film and '$\alpha_c$' is the CTE of the ceramic substrate. The method can comprise temperature lowering comprising depositing a film deposition at Td whose $\alpha_f$ is lower or higher than the $\alpha s$ of the ceramic substrate and the composition of the films is such that $|(n_{film})-(n_s)|>0.10$, and then lowering the temperature from Td to reach a lower Tc or raising the temperature to a higher Tc. At least a portion of the thickness of the deposited film is converted so that it has a closely matched refractive index which as described above refers to $|(n_{film})-(n_s)|\leq0.10$, such as from 0 to 10.051, or from 0 to 10.051. The difference in the CTE mismatch between the deposited film and the substrate $|(\alpha_f-\alpha_s)|$ can range from $1.0\times10^{-6}$/K to $2\times10^{-5}$/K, with another range being $2.5\times10^{-6}$/K to $2\times10^{-5}$/K, and yet another range being $5.0\times10^{-6}$/K to $2\times10^{-5}$/K.

The film converting conditions result in a fully or partially converted film in a range of 5% to 100% of its original as-deposited thickness, such as 10% to 90% of the original as-deposited film thickness. As described above, the converted film portion provides at least one change property comprising a change in film composition, phase and/or microstructure, so that a difference in refractive index at Tc of the converted film and the ceramic substrate is $\leq|0.10|$.

The change in composition of the converted film portion comprises at least one of an increase in oxygen content by at least ($\geq$) 10 mole percent, a decrease in nitrogen content by at least ($\geq$) 10 mole percent, or a decrease in carbon content by at least ($\geq$) 10 mole percent. Examples of a change in composition is an as-deposited AlN film having its thickness fully or partially converted ranging from 5% to 95% of its thickness converted, such as 10% to 80% converted into $Al_2O_3$, a SiCON film converted into $SiO_2$, and an $AlO_aN_b$ film converted into $Al_2O_3$ or AlON. Regarding a phase change, for example, the as-deposited film may be amorphous and after the conversion the converted film may become polycrystalline, or be transformed into a different phase such as gamma or delta phase of alumina by transforming into the alpha phase. The microstructure change can comprise an average grain size increase of at least ($\geq$) 20 percent. For example the average grain size of the converted film portion can range from 10 A to 40 microns and be larger than the average grain size of the deposited film by at least 10 percent, such as by 20% to 20,000%.

The temperature is then lowered from Tc to room temperature. One advantage of disclosed methods is that the converted film portion acquires a closely matched refractive index to the ceramic substrate reflected in $|(n_f)-(n_s)|\leq0.10$. Another advantage is that significant compressive thermal stresses are achieved when the conversion of the film takes places at Tc being at a different temperature compared to Td.

Figure 2:
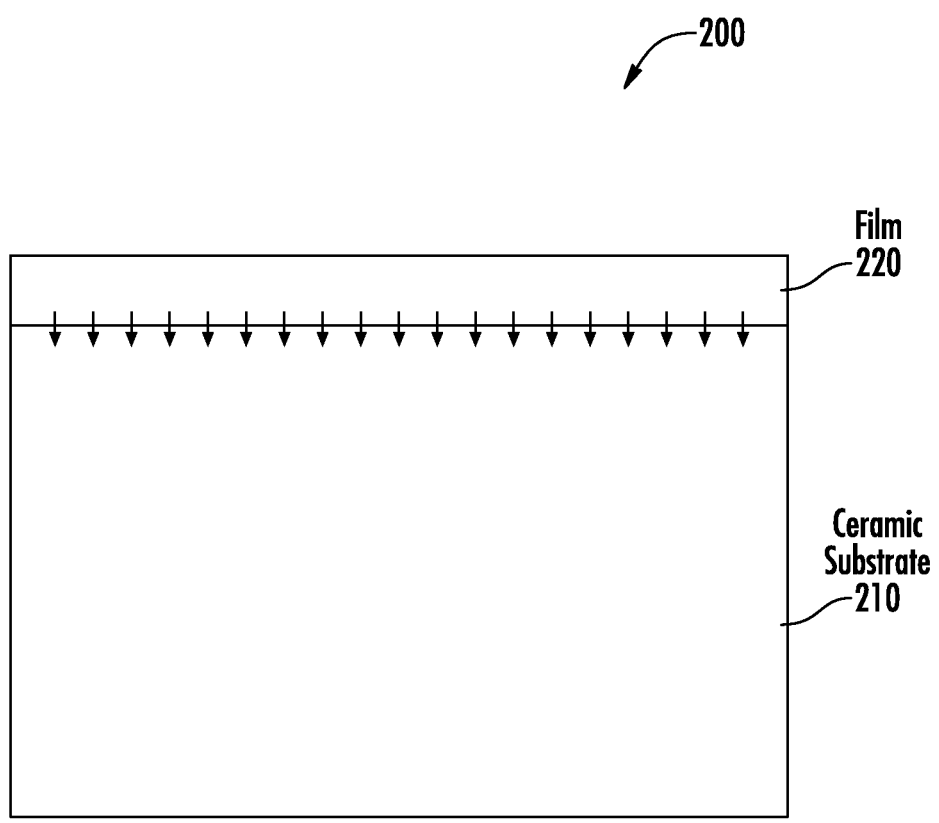
FIG. 2 depicts a cross sectional view of a disclosed article having a film on a ceramic substrate, where the film applies compressive stress to the ceramic substrate.

FIG. 1 is a flow chart that shows steps in an example method 100 of forming an article comprising a film on a ceramic substrate, where the film provides a compressive stress to the ceramic substrate. FIG. 2 depicts a cross sectional view of a disclosed article 200 having a film 220 on a ceramic substrate 210, where the film 220 applies compressive stress shown by the arrows provided to the ceramic substrate 210.

The ceramic substrate 210 can either be optically transparent or can be opaque. An optically transparent substrate is defined herein as a material which allows at least 40 percent of the intensity of visible radiation that is in a wavelength range from 390 to 700 nanometers to pass through a substrate having a thickness of 500 microns or more. Examples of transparent ceramic substrates include glass such as a silica-based glass, sapphire, alumina, a spinel ($MgAl_2O_4$ in the cubic crystal system), tantalates, peroskites, AlON fluorides, oxides, carbides, nitride, and diamond. Examples of deposited films include AlN, AlON, AlSiON, SiON, SiC, SiN, or SiAlOCN deposited at a Td ranging from $-200°$ C. to $2,500°$ C., typically $1,000°$ C. to $1,500°$ C. The thickness of the ceramic substrate 210 can vary from 100 microns to 300 mm. The refractive of such materials can vary from 1.3 to 2.9. As described above, the ceramic substrate 210 can have a hardness ranging from 6 to 10 on the Mohs scale, a Vickers hardness varying from 500 kg/mm² to 10,000 Kg/mm², or a Knoop Hardness varying from 500 to 10,000.

Step 101 comprises depositing a film on a ceramic substrate 210 at $T_d$ to form an article, where the film 220 has a CTE that is lower or higher than a CTE of the ceramic substrate. The film can include at least 10 percent aluminum. The as-deposited film has a CTE difference relative to the ceramic substrate at $Td|(\alpha_f-\alpha_s)|$ of at least $1.0\times10^{-6}$/K up to about to $2\times10^{-5}$/K and a difference in refractive index $|(n_f)-(n_s)|$ of $>|0.10|$. The film can be deposited on at least one surface of the substrate, or on all surfaces of the substrate, such as on the top side and on the bottom side. The thickness of the film as describe above can vary from 100 A to 100 microns, such as 1,000 A to 100 microns, or 5,000 A (0.5 microns) to 100 microns.

The film 220 can be deposited by a wide variety of techniques such as physical vapor deposition (PVD) or chemical vapor deposition (CVD). In these techniques the vacuum level in the deposition chamber can vary from $1.0\times10^{-10}$ torr to 100 torr. Examples of PVD methods include evaporation, sputtering, Molecular beam epitaxy (MBE), and cathodic arc. Ionized beam deposition can also be used. Examples of CVD include low pressure CVD (LPCVD), high pressure CVD including plasma enhanced CVD (PECVD), Metalorganic vapor phase epitaxy (MOCVD), Hydride Vapor Phase Epitaxy (HVPE), and Atomic Layer Deposition (ALD). The as-deposited film can have a grain size varying from amorphous (no grains) to polycrystalline with grain size varying from 1 nm to 10 microns. The surface of the ceramic substrate 210 generally has a root mean square (RMS) roughness ranging from 1 A to 10 microns, such as 1 A to 1,000 A. As described above, the compressive or tensile stress in the as-deposited film can vary from 000.1 Gpa and 10 GPa. The hardness of the film should generally be greater than Mohs 6.0, Vickers hardness greater than 500 Kg/mm$^2$ or Knoop Hardness greater than 500.

Step 102 comprises film converting comprising lowering or raising a temperature from $T_d$ to a Tc that is at least 100° C. different from the Td, wherein the conditions for the film converting result in at least a portion of the thickness of the film 220 becoming a converted film changing at least one property comprising composition, phase and microstructure so that $(|(n_{film})-(ns)|<0.10)$. As described above, the change in composition is such that there is at least one of an increase in oxygen content by at least ($\geq$) 10 mole percent, a decrease in nitrogen content by at least ($\geq$) 10 mole percent, a decrease in carbon content by at least ($\geq$) 10 mole percent, and a microstructure change having an average grain size increase of at least ($\geq$) 20 percent. The conversion process can take place using transient thermal techniques such as rapid thermal processing (RTP) or pulsed or continuous wave laser heat treatment. In the case of RTP/laser heat treatment, the film/substrate can be heated to temperatures from 300° C. to 2,000° C. for a time of 1 picosecond to 10 minutes.

Step 103 comprises lowering a temperature of the article from Tc to room temperature. The cooling process can be controlled by either removing the article from the furnace/reactor or by cooling at a rate ranging from 0.1 K/min to 100 K/min. After cooling to room temperature the surface of the converted film may acquire a roughness value greater than 1 A, such as 5 A, 15 A or 20 A (2 nm) up to 1,000 A when measured by an optical profilometer with scanning area of at least 100 micron×100 micron. Such rough surfaces may lead to optical scattering or reduced strength. The cooled surfaces can then be polished to achieve an average surface roughness less than 2 nm, such as less than 1 nm, such as less than 0.5 nm when measured by an optical profilometer with scanning area of at least 100 micron×100 micron.

The Td can vary from 300° C. to 3,000° C. with typical range from 800° C. to 2,200° C., such as 900° C. and 1800° C., while the Tc can be from 100° C. to 2,500° C. with a typical range being 500° C. to 1500° C. The film can impart biaxial compressive stress for a sapphire or alumina substrate. The sapphire or alumina substrate can be polycrystalline, amorphous, or a single crystal. For single crystal sapphire the surface may be cut +/−20 degrees from the C-plane, R-Plane or M-plane.

The composition of the deposited film and converted film portion can be $Al_xY_{(1-x)}O_aC_bN_c$ where the values of x range between 0 and 1, and the value of "a" ranges from 0 to 2, the value of "b" ranges from 0 to 1, while the value of "c" ranges from 0 to 2. Y refers to a doping element which can be Si, Ga a transition metal such as Ti, Cu, V, or a non-transition metal. In an embodiment where the substrate is sapphire ($Al_2O_3$), the deposited film is $AlO_aN_b$, the values of "a" and "b" are adjusted $|(n_{film})-(n_s)|>0.10$ so that the converted film portion is $AlO_aN_b$, and the values of "a" and "b" are so adjusted during conversion such that after conversion $|(n_{film})-(n_s)|\leq0.10$, such as $|(n_{film})-(n_s)|<0.05$. If the substrate is single crystal sapphire, the converted film portion in one of the embodiments is polycrystalline alumina ("b"=0.0 and "a"=1.5). Another embodiment when the substrate is sapphire the deposited film $SiO_aN_b$ the values of "a" and "b" are adjusted $|(n_{film})-(n_s)|>0.10$ so that and the converted film is $SO_aN_b$, the values of "a" and "b" are adjusted such that after conversion $|(n_{film})-(n_s)|\leq0.10$ or $|(n_{film})-(n_s)|<0.05$. As described above, the compressive stress in the converted film at room temperature can range from 0.001 GPa to 10 GPa, typically in a range from 0.01 GPa to 2 GPa such as in a range from 0.1 GPa to 1 GPa.

The Tc for this temperature lowering embodiment is generally be at least 100° C. lower than Td. As noted above, the conversion of the film material can change the composition of the film ranging from 10% to 100% conversion of its as-deposited thickness. The conversion can take place via thermal nitridation, carburization, oxidation, or a mixture of these techniques by either providing gaseous species of oxygen, nitrogen, carbon in a process chamber and/or by depositing a solid carbon containing compound film having a thickness between 10 A to 1 micron on the surface of the originally deposited film. A mixture of oxygen, carbon and nitrogen containing gases can also be flown into the process chamber. The conversion process can be also be enhanced by RF energy sufficient in power for creating a plasma formed by these gases.

Once the deposition is completed the film is for example cooled down to Tc and it is converted at least in part of it thickness (e.g., by plasma enhanced oxidation, nitridation or carbidization or a combination of these) to a different phase or a different material composition which to provide $|(nfilm)-(ns)|<0.10$. The hardness of the converted film portion is at least 50 percent of the hardness of the substrate with Vickers hardness values ranging from 500 Kg/mm$^2$ to 10,000 Kg/mm$^2$ or Knoop Hardness value ranging from 500 to 10,000 or Mohs hardness ranging from 6.0 to 10.0.

A criteria for choosing the as-deposited film material is $|(\alpha_f-\alpha_s)|>1.0\times10^{-6}$/K) such as $|(\alpha_f-\alpha_s)|$ from $1.0\times10^{-6}$/K) to $2.0\times10^{-5}$/K. The thermal compressive stress ($\sigma$) produced by this process on the films is given by the following compressive stress formula:

$$\sigma=E[(\alpha_f-\alpha_s)(T_d-T_c)+(\alpha_{fc}-\alpha_s)(T_c-T_{RT})]+E_{intrinsic}$$

Where σ is the thermal compressive stress in the film (f) and E is the Young's modulus of the substrate (s), $\alpha_{fc}$ is the thermal expansion coefficient of the film after conversion, $T_{RT}$ is room temperature, and $E_{intrinsic}$ are the intrinsic growth stresses during deposition. If the converted film has the same composition as the substrate then $\alpha_{fc}=\alpha_c$. This resulting σ of the film when lowered to room temperature as described above can have a compressive stress ranging from 0.001 Gpa to 10 Gpa, such as in a range from 0.1 to 2.0 GPa. The CTE mismatch of converted film and the substrate $(\alpha_{fc}-\alpha_s)$ can be less than 50% of the CTE mismatch between the deposited film and the substrate $|(\alpha_f-\alpha_s)|$ with a range of $1.0\times10^{-6}$/K to $1.0\times10^{-5}$/K. In some embodiments $\alpha_{fc}=\alpha_s$.

An optional disclosed feature is the surface roughness of the ceramic substrate which as described above can vary from 0.5 A to 10 microns RMS, with typical roughness values ranging from 2 A to 10 microns when measured in an area of 500 micron×500 micron, or lower than 2 A. As the converted film as disclosed herein generally has a closely matched refractive index to the ceramic substrate ($|(n_{film})-(ns)|\leq 0.10$), the roughness of the substrate does not create significant optical scattering. An advantage of a relatively rough substrate surface is to improve the adherence of the film by creating a 3-dimensional stress graded layer at the top surface of the substrate.

Optionally the converted film after cooling to room temperature can be polished by chemical mechanical polishing (CMP) or a diamond lapping method to achieve a smooth surface. The CMP process can be performed with a slurry containing colloidal silica particles with a pH in the range of 5 to 13.5, and a particle concentration varying from 0.1% to 70 weight %, and a primary particle size in the range of 2 nm to 300 nm. During CMP the polishing pressure can be in the range of 0.1 psi to 25 psi.

The substrate/film structure of the article can be heated treated in a variety of atmospheres (e.g., air, oxygen, vacuum nitrogen, etc.) at a temperature in the range of 200° C. to 3,000° C., with times varying from 1 sec to 1,000 hours, with typical time ranging between 10 minutes and 10 hours.

One specific disclosed embodiment deposits the film on the ceramic substrate at a $T_d$ which is lower than Tc, where the film has a coefficient thermal expansion (CTE) that is lower than a CTE of the ceramic substrate $(\alpha_f-\alpha_s))<0$) and ($|(nfilm)-(ns)|\leq 0.10$) after the film conversion process. Film converting comprises increasing the temperature from $T_d$ to reach a temperature $T_r$ which is at an elevated temperature greater than 1,000° C. without any chemical conversion, holding at temperature Tr for a fixed period of time ranging from 2 seconds to up to 7 days so the thermal stresses are substantially relaxed, and then lowering the temperature to $T_c$, where film converting conditions results in the film becoming a converted film in at least one of composition and phase so that $|(nfilm)-(ns)|\leq 0.10$. The temperature is then lowered from Tc to room temperature. During the film deposition the film can acquire a stress up to +/−10 GPa. The thickness of the deposited or converted film can vary from 100 A to 100 microns. The thickness of the film can vary from 100 A to 100 microns. The film conversion process can be done either by adding using one or more carbon, oxygen or nitrogen containing gases or adding a thin layer (10 A to 1 micron) of a carbon containing solid on the surface of the film. The σ produced by this process on the films is given by the formula for σ shown above.

An example of this embodiment is the deposition of SiAlON film on a sapphire or alumina substrate at a deposition temperature ranging from −100° C. to 600° C. so that ($|(nfilm)-(ns)|>0.10$), and heating the film/substrate to 1,200 to 2,500° C. to reach the relaxation temperature, relaxing the stresses and then reducing the temperature to Td for film conversion into a new phase/microstructure or composition so that ($|(n_{film})-(ns)|\leq 0.10$).

An example of a temperature raising film conversion method is to impart biaxial compressive stress for a sapphire or alumina, glass, spinel or a transparent ceramic substrate. The sapphire or alumina substrate can be polycrystalline, amorphous or single crystalline. For single crystal sapphire the surface may be cut +/−20 degrees from the C-plane, R-Plane or M-plane. One example substrate is silica based glass. The deposited films has a composition SiCON so that the $|(n_{film})-(n_s)|>0.10$. The difference in the CTE mismatch between the as-deposited film $|(\alpha_f-\alpha_s)|$ as described above can range from $1.0\times10^{-6}$/K to $2\times10^{-5}$/K.

Figure 3:
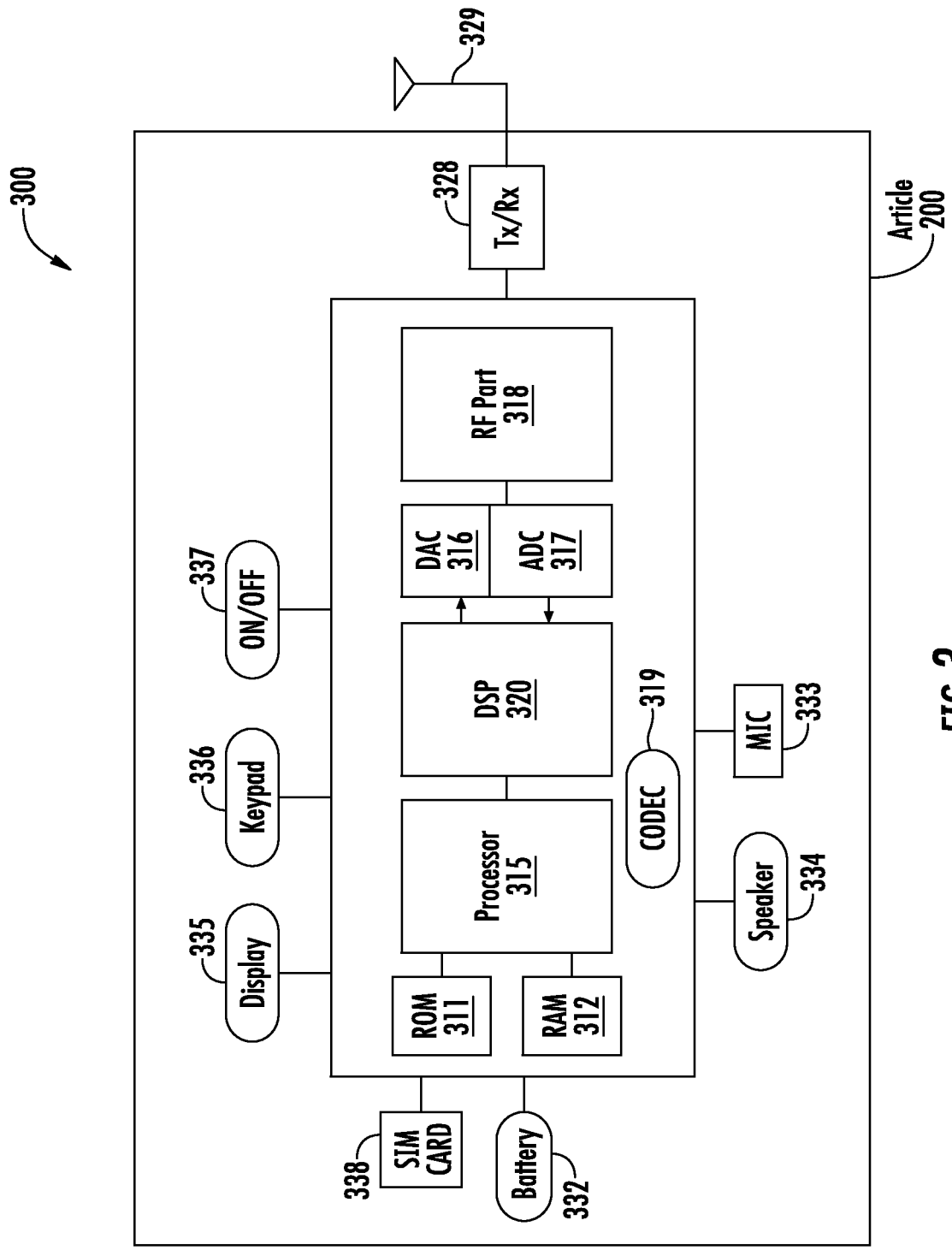
FIG. 3 shows a depiction of an example cellular phone showing its primary electronic components having a display screen that includes the article shown in FIG. 2.

FIG. 3 shows a depiction of a cellular phone 300 such as a smartphone having a display screen using the article 200 shown in FIG. 2 shown as a generic mobile phone. The cellular phone 300 includes memory shown as Read-only memory (ROM) 311 and Random-access memory (RAM) 312, a processor 315 such as a microprocessor for running applications, a Digital Signal Processor (DSP) 320, a Digital-to-Analog Converter (DAC) 316, an Analog-to-Digital Converter (ADC) 317, and a radio frequency (RF) part 318 including an RF frequency up-converter and RF frequency down-converter. The basic component used for frequency conversion by the cellular phone 300 is an RF mixer. A CODEC (coder-decoder) 319 is also shown included.

The cellular 300 includes an antenna 329 and a transmit/receive (Tx/Rx) switch 328. A Tx/Rx Switch 328 is included as there is only one antenna 329 used for both transmit and receive at different times, where the Tx/Rx Switch 328 is used to connect both the Tx path and the Rx path with one antenna at different times.

The Tx/Rx Switch is controlled automatically by the DSP 320, such as based on a frame structure for Global System for Mobile Communications (GSM) with respect to the physical slot allocated for that particular GSM mobile phone in both downlink and uplink. The baseband processing performed by the DSP 320 converts voice/data to be carried over the air interface into a baseband signal. This is the core part which changes modem to modem for various air interface standards.

For Speech/audio, the CODEC 319 is used to compress and decompress the signal to match the data rate to the frame it has to fit in. The ADC 317 and DAC 316 are used to convert analog speech signal to digital signal and vice versa in the mobile. At the transmit path, ADC converted digital signal is given to speech coder. There are various ADCs available, among them popular one is sigma delta type. AGC (Automatic Gain Control) and AFC (Automatic Frequency Control) is used in the receiver path to control gain and frequency. AGC helps maintain working of the DAC 316 satisfactorily, as it keeps signal within the dynamic range of DAC 316. AFC keeps frequency error within limit to achieve better receiver performance.

An application layer runs on the microprocessor 315. Various applications run in a GSM mobile phone including audio, video and image/graphics applications. A battery 332 is the source of power to make/to keep mobile phone functional. A microphone (MIC) 333 converts air pressure variations (result of speech) to electrical signal to couple on the printed circuit board (PCB) for further processing. A speaker 334 converts electrical signal to audible signal (pressure vibrations) for a human being to hear. A display 335 is provided, such as a LCD (liquid crystal display), TFT (Thin-film transistor) screen, OLED (organic light emitting diode) type. A keypad 336, and an on/off switch 337, and a subscriber identification module (SIM) card 338 are also provided.

Disclosed articles can be used for a wide variety of other devices, such as almost any device or system having a display screen.

Disclosed articles can be used for a wide variety of other devices, such as almost any article having a display screen.

EXAMPLES

Disclosed embodiments are further illustrated by the following specific Examples, which should not be construed as limiting the scope or content of this Disclosure in any way.

Example 1

In one embodiment, an $AlO_aN_b$ film (a+b<1.5) is deposited on an AlON, sapphire, or an alumina substrate. For this example, the CTE of the film is lower than that of the substrate. One case is where the value of "a"=0.0, and typically the value of "a" varies from 0.0 to 0.5. Also the refractive index of the deposited $AlO_aN_b$ film is higher than the substrate by >0.10. This is achieved by processing for tuning the value of "a" and "b" in the film. The deposition temperature can vary from 500° C. to 2,500° C. with typical deposition temperatures of 800° C. to 1700° C. The film can be deposited by sputtering, physical vapor deposition, evaporation, CVD, or HVPE based methods. The thickness of the film can vary from 100 A to 10 microns. The microstructure during the deposition process can vary from amorphous to polycrystalline.

After the deposition process the intrinsic stresses in the film can range from +1 GPa to −1 GPa. After conversion, a film of $AlO_xN_y$ is formed where (x+y<1.5) where x>a, and y<b and the refractive index of the film is approximately same as the substrate. One specific case has the value of "x"=1.5 and y=0 and the range of values of "x" lies from 0.5 to 1.5. The film material conversion process takes place by oxidation, at least a 100° C. temperature change lower than the deposition temperature. For oxidation, an oxygen containing gas (air, oxygen, etc.) is flowing in the deposition chamber. Plasma induced processes to increase the reactivity of oxygen can also be used. The conversion process at temperature Tc can last from 1 minute to several hours. After the conversion process the article can be cooled to room temperature. It is expected that the compressive thermal stresses in the film after it is cooled down can range from 0.01 GPa to 10 GPa with a range from 0.1 GPa to 2.0 GPa. The refractive index of the film and the substrate after conversion are approximately the same ($|(n_{film})-(n_s)|\leq 0.10$). The average grain size of the converted film is expected to range from 10 A to 100 micron and the hardness of the film can range from Mohs value greater than 5.0 or Vickers Hardness between 500 Kg/mm² to 4,000 Kg/mm², Knoop Hardness value from 500 to 3,000. In some embodiments the substrate is sapphire and after conversion the film on the surface of the substrate is alumina.

In this example, an alumina film ($AlO_{1.5}$ or $Al_2O_3$) can be either in an alpha (a) phase or the delta or gamma phase with a polycrystalline grain size range such as 10 A to 40 microns. The alumina film may have a compressive stress ranging from 0.01 GPa to 2 GPa, while the sapphire substrate has a tensile stress of at least 10 times lower than the film's compressive stress. At least one of the lattice parameters of the alpha alumina in the film will be at least 0.01% smaller than the ideal value for alumina (a=4.785 A, c=12.991 A) when measured by materials characterization techniques such as X-ray diffraction based methods and will be at least 0.01% higher than corresponding lattice parameters of the sapphire substrate. The lower lattice parameter in the film is due to compressive effects.

Example 2

In this example the film is on a sapphire, alumina or AlON substrate is the deposition of $SiC_aN_bO_c$ (where a+b+c<2.0) film at a temperature between 500° C. and 2,500° C. In this case the CTE of the film is lower than the substrate. Also the composition of the film is controlled so that the refractive index of the film is higher than the substrate ($|(n_{film})-(n_s)|$ by at least a value greater than 0.10. The films can be deposited by sputtering, evaporation, PVD, or CVDc. After the deposition the temperature is at least reduced by 100° C. for the conversion process. In the conversion process the film is oxidized so that the amount of carbon or nitrogen is reduced and the oxygen content in the film is increased. After the conversion process the refractive index of the film and the substrate are approximately the same ($|(n_{film})-(n_s)|\leq 0.10$).

The film can be amorphous or polycrystalline with grain size varying from 10 A to 100 microns. The hardness of the film can range from Vickers Hardness value of 500 Kg/mm² to 4500 Kg/mm², or Knoop Hardness value from 500 to 4,000. An example of a substrate is single crystal sapphire. After conversion at temperature Tc the converted film can be $SiO_aN_b$ where (a+b<2.0). The compressive thermal stresses after the film is cooled to room temperature ranges can be from 0.1 GPa to 10 GPa.

Example 3

In this example a film on glass substrate is deposited comprising $SiN_aO_b$ (where a+b<2.0) at a temperature between −200° C. and 1200° C. In this case the CTE of the film is higher than the ceramic substrate. Also the composition of the film is controlled so that the refractive index of the film is higher than the ceramic substrate by at least a value greater than 0.10. The films can be deposited by sputtering, evaporation, PVD, or CVD. After deposition the temperature can be increased by at least 100° C. for the conversion process. In the conversion process the film is oxidized so that the amount of nitrogen is reduced and the oxygen content in the film is increased. After the conversion process the refractive index of the film and the substrate are approximately the same ($|(n_{film})-(n_s)|\leq 0.10$). The film can be amorphous or polycrystalline with grain size varying from 10 A to 100 microns. The hardness of the film can range from Vickers Hardness value of 500 Kg/mm² to 4500 Kg/mm², or Knoop Hardness value from 500 to 4,000. An example substrate is a substantially silica-based glass substrate. After conversion at temperature Tc, the converted film can be $SiO_2$. The compressive thermal stresses after the film is cooled to room temperature ranges from 0.01 GPa to 2 GPa. The hardness of the film is generally greater than Mohs 6.0 or a Vickers hardness greater than 1,000 GPa.

While various embodiments of the invention have been described above, it should be understood that they have been presented by way of example only, and not limitation. Numerous changes to the disclosed embodiments can be made in accordance with this Disclosure without departing from the spirit or scope of the subject matter disclosed herein. Thus, the breadth and scope of this Disclosure should not be limited by any of the above described embodiments.

Rather, the scope of this Disclosure should be defined in accordance with the following claims and their equivalents.

The invention claimed is:

1. A method to provide compressive stress to substrates, comprising:
    depositing a nitride film on a ceramic substrate at a deposition temperature (Td) to form an article, said nitride film having a difference in a coefficient thermal expansion (CTE) relative to said ceramic substrate at said Td of at least $1.0 \times 10-6/K$ and a difference in a refractive index of greater than (>) 0.10;
    converting said nitride film comprising lowering or raising a temperature from said Td to reach a changed temperature (Tc) that is at least 100° C. different from said Td, wherein conditions for said converting result in said nitride film becoming in at least a portion of its thickness a converted film through a composition change such that there is an increase in oxygen content by at least (≥) 10 mole percent, a decrease in nitrogen content by at least (≥) 10 mole percent, or a decrease in carbon content by at least (≥) 10 mole percent, so that a difference in said refractive index at said Tc of said converted film and said ceramic substrate is ≤|0.10|, and
    lowering a temperature of said article from said Tc to room temperature, wherein said nitride film is an $AlO_aN_b$ film, wherein a+b<1.5, a SiCON film, or a SiAlCON film.

2. The method of claim 1, wherein said substrate comprises sapphire.

3. The method of claim 1, wherein said converting comprises flowing one or more of carbon, oxygen or nitrogen containing gases.

4. The method of claim 1, wherein said article is optically transparent.

5. The method of claim 1, wherein said substrate comprises a silica-based glass, sapphire, alumina, or a spinel.

6. The method of claim 1, wherein said portion of said converted film is under a compressive stress, and wherein said substrate is under a tensile stress.

7. The method of claim 1, wherein said article comprises a display screen of a cellular phone.

8. The method of claim 1, wherein said portion of said converted film is from 10% to 80%.

9. The method of claim 1, wherein after said converting said difference in said refractive index of said nitride film and said ceramic substrate is <10.051.

10. The method of claim 1, wherein, after said converting of said nitride film, a compressive stress in said film is 1 MPa to 10 GPa.

11. The method of claim 1, wherein said nitride film is an $AlO_aN_b$ film, wherein a+b<1.5 and wherein said converted film is an $AlO_xN_y$ film wherein x+y<1.5 and wherein x>a and y<b.

12. The method of claim 11, wherein a is from 0 to 0.5.

13. The method of claim 11, wherein a=0.

14. The method of claim 11, wherein x is from 0.5 to 1.5.

15. The method of claim 11, wherein x=1.5 and y=0.

16. The method of claim 1, wherein said nitride film is a SiCON film and wherein said converted film is $SiO_xN_y$ film, wherein x+y<2.

* * * * *